United States Patent [19]

Waldron et al.

[11] Patent Number: 5,185,652
[45] Date of Patent: Feb. 9, 1993

[54] ELECTRICAL CONNECTION BETWEEN BUSES ON A SEMICONDUCTOR INTEGRATED CIRCUIT

[75] Inventors: Robert D. Waldron; Harold S. Crafts, both of Fort Collins, Colo.

[73] Assignee: NCR Corporation, Dayton, Ohio

[21] Appl. No.: 706,428

[22] Filed: May 28, 1991

[51] Int. Cl.$^5$ ..................... H01L 21/60; H01L 23/48
[52] U.S. Cl. .................... 257/758; 257/774; 257/775
[58] Field of Search ............... 357/65, 68, 67

[56] References Cited

U.S. PATENT DOCUMENTS

| | | | |
|---|---|---|---|
| 3,795,845 | 3/1974 | Cass et al. | 357/68 |
| 4,021,838 | 5/1977 | Warwick | 357/68 |
| 4,587,549 | 5/1986 | Ushiku | 357/71 |
| 4,975,758 | 12/1990 | Crafts | 357/45 |

FOREIGN PATENT DOCUMENTS 54-12263 1/1979 Japan .
58-30157 2/1983 Japan .
62-237737 10/1987 Japan .

OTHER PUBLICATIONS

Braen, "Power Distribution for Large-Scale IC Devices", IBM TDB, vol. 16, No. 7, Dec. 1973, pp. 2308-2309.

Dahmen, "Measuring the Contact Resistance of Metallization on Silicon", IBM TDB, vol. 14, No. 3, Aug. 1971 p. 969.

Primary Examiner—Eugene R. LaRoche
Assistant Examiner—Viet Q. Nguyen
Attorney, Agent, or Firm—Paul W. Martin; Matthew R. Jenkins

[57] ABSTRACT

An electrical connection between a first bus and a second bus on a semiconductor integrated circuit device manufactured using conventional CMOS technology. The first bus has a horn shape which permits a plurality of vias to be arranged in an arc thereon. This arrangement of vias facilitates permitting the current to flow substantially evenly between a first bus and a second bus.

24 Claims, 4 Drawing Sheets

ELECTRICAL CONNECTION BETWEEN BUSES ON A SEMICONDUCTOR INTEGRATED CIRCUIT

BACKGROUND OF THE INVENTION

1. Field of the Invention

This invention relates a semiconductor integrated circuit device, and more particularly, it relates to an electrical connection in such circuit.

2. Description of Related Art

In most semiconductor devices of the prior art, power is transmitted from a power source on the semiconductor device or chip over a power bus A as illustrated in the prior art arrangement shown in FIG. 1. A plurality of row buses B extend perpendicularly away from the power bus A. The row buses B have a plurality of circuits or cells C which are coupled thereto and which receive current from the row bus B. As illustrated, each row bus B is coupled to the power bus A by a series of vias D.

One of the problems with this arrangement is that the current would flow primarily through the first via D-1. As more cells C were added to the row bus B, the current flowing through the first via D-1 would increase. This caused the first via D-1 to be overloaded. The other vias would become "shadowed" because the current would only flow through the first via D-1 and not the other vias. The reliability of the electrical connection between the row bus B and power bus A became highly dependent on the current conducting capacity of the first via D-1. In many instances, one or more of the cells coupled to the row bus B would malfunction or simply fail because the first via D-1 could not conduct the current required. Overloading the first via D-1 would also cause that via to "burn out". The current would then flow through the next via D-2 until all the vias D became successively overloaded and burnt out, eventually causing the row bus B to be disconnected from the power bus A.

SUMMARY OF THE INVENTION

It is therefore an object of the present invention to provide an electrical connection which avoids the current shadowing effect found in traditional series configuration vias.

In one aspect of the invention there is provided an electrical connection between a first and second bus separated by an insulator comprising: a plurality of vias connecting an end of the first bus to the second bus, said plurality of vias being arranged so that current will flow substantially evenly through said plurality of vias.

In another aspect of the invention there is provided a method for transferring current from a row bus to a power bus through a plurality of vias comprising the step of: evenly distributing current flowing through the plurality of vias.

An advantage of this invention is that it provides an arrangement of vias which permits current to flow substantially evenly through the plurality of vias.

Another advantage of this invention is that it equalizes current flow through each via.

Yet another advantage of this invention is that it extends the useful life of an electrical connection between a row bus and a power bus.

Still another advantage of this invention is that it enhances the current carrying capacity of the row bus.

DESCRIPTION OF THE PREFERRED EMBODIMENT

Figure 1:
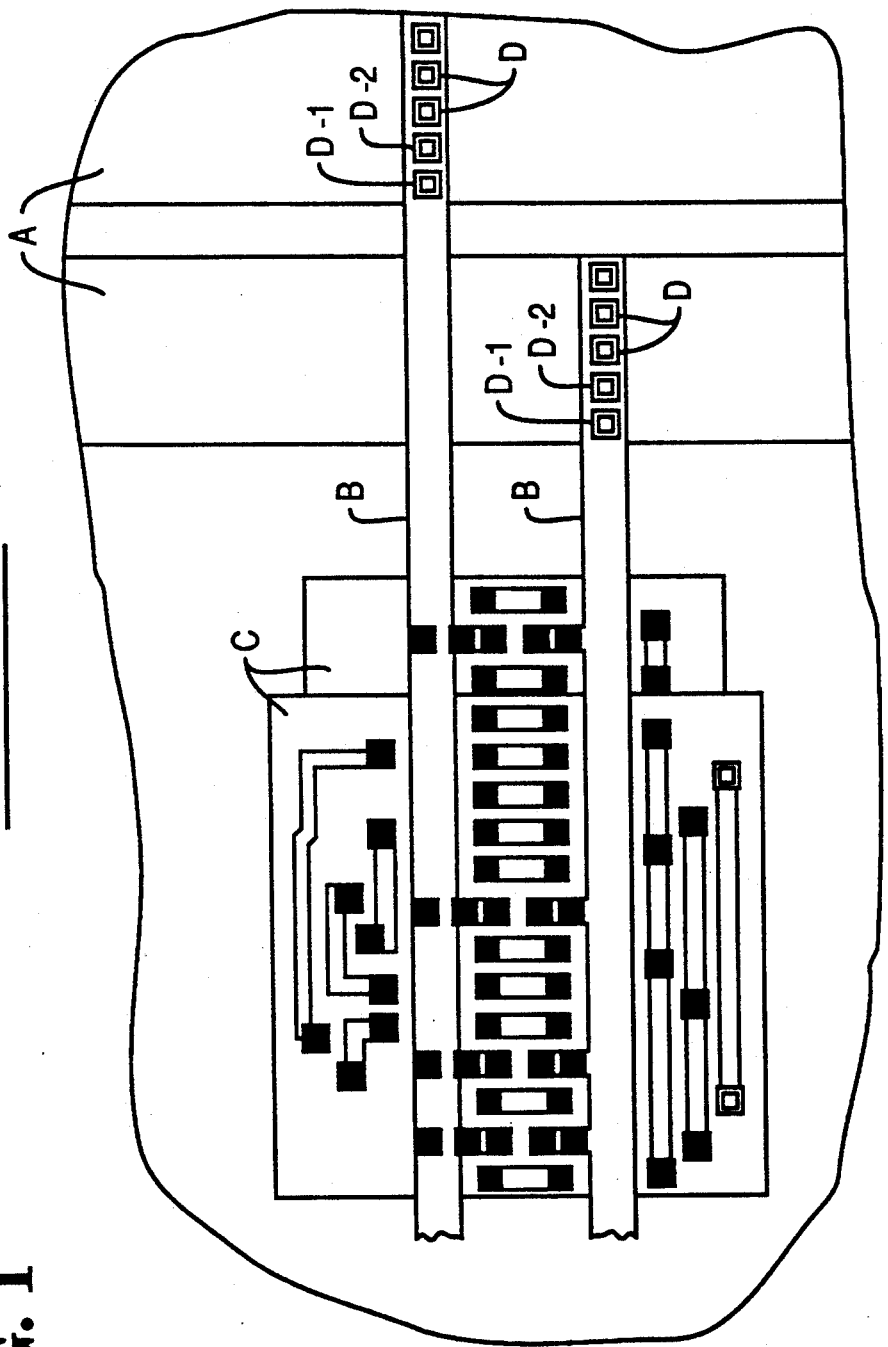
FIG. 1 is a fragmentary view of a conventional electrical connection.
Figure 2:
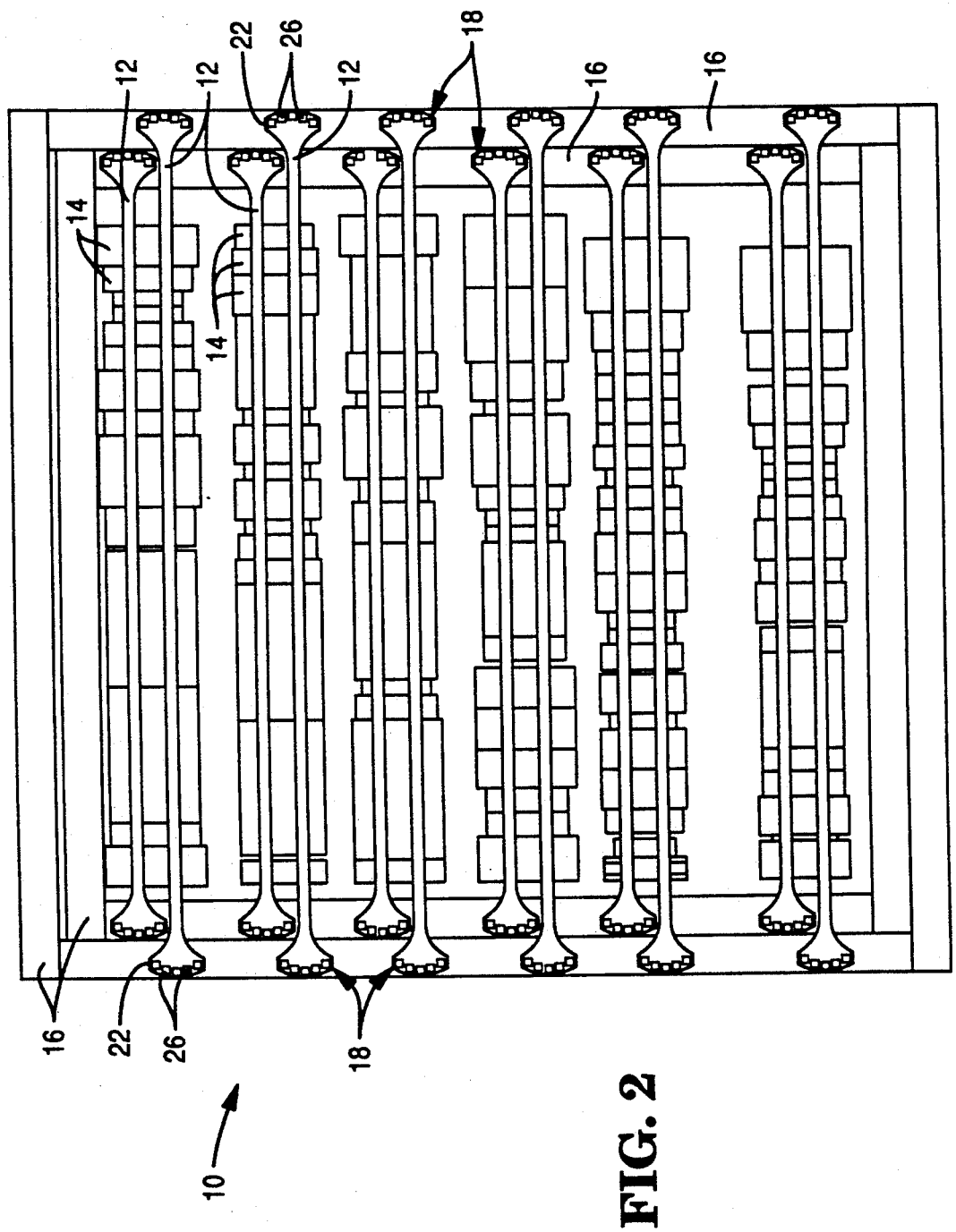
FIG. 2 is a schematic diagram of a chip having a preferred embodiment of this invention incorporated therein.

FIG. 2 shows a chip 10 in which a preferred embodiment of this invention may be used. The chip comprises a plurality of row buses 12 each having a plurality of integrated circuits or cells 14 conventionally coupled thereto. Each row bus 12 is coupled to a power bus 16 by an electrical connection 18. The power bus 16 conducts current between a power supply (not shown) to the row bus 12 for energizing each cell 14 on the row bus 12. The row buses 12 are narrower than the power bus 16 because they do not carry as much current and also to efficiently utilize space on the chip 10. In a preferred embodiment, the power bus 16 is five times wider than the row bus 12.

Figure 3:
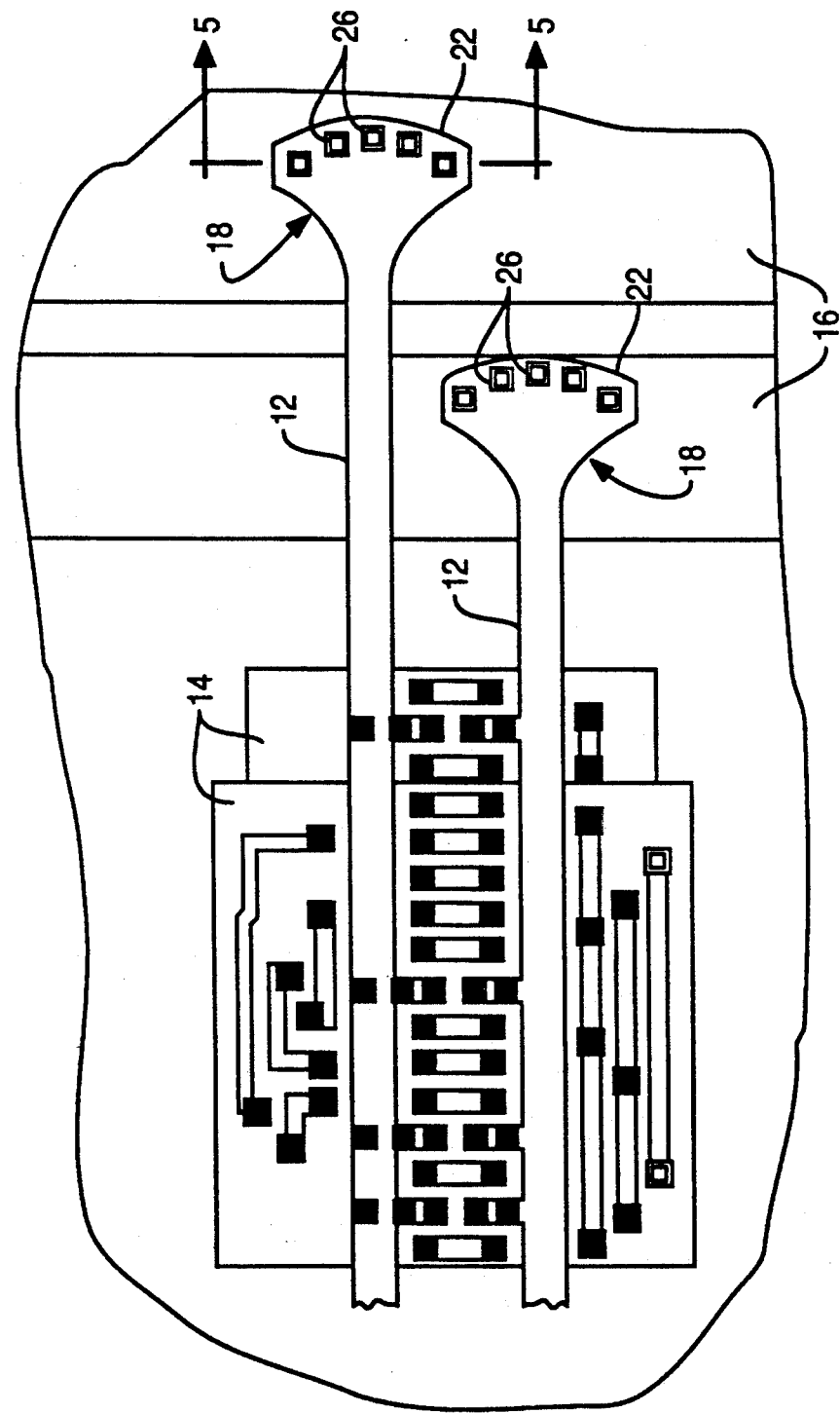
FIG. 3 is a fragmentary enlarged view of a portion of the chip shown in FIG. 1.

The row bus 12 (FIGS. 3 and 4) has an end 22 which is generally fan or horn shaped. In a preferred embodiment, the end 22 has a side 22-1 (FIG. 4) and a side 22-2 which are generally symmetrical along a center line 24 which lies in the general direction in which the current flows on the row bus 12. Although not shown, the end 22 could have sides 22-1 and 22-2 which are not symmetrical. For example, the end 22 could be constructed in the shape of either side 22-1 or side 22-2. Beginning at a mouth 25 of the end 22, the end sides 22-1 and 22-2 gradually diverge away from the center line 24.

Figure 4:
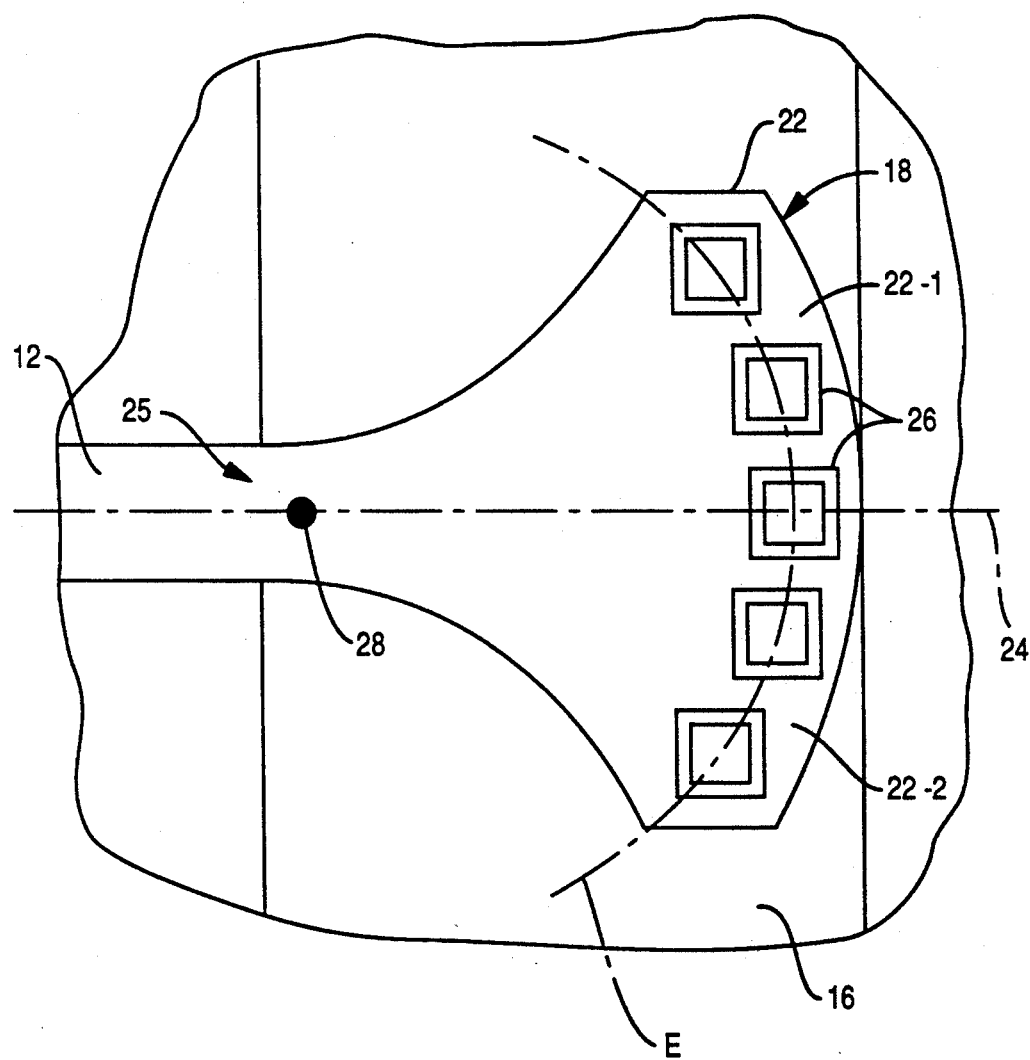
FIG. 4 is an enlarged fragmentary view of an electrical connection according to a preferred embodiment of this invention.
Figure 5:
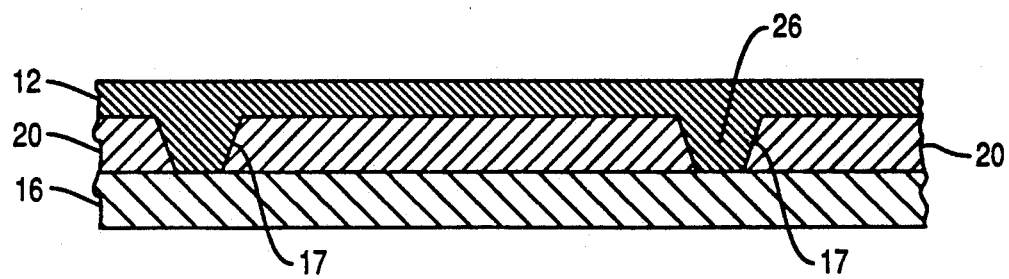
FIG. 5 is a sectional view, taken along the line 5—5 in FIG. 3, showing the connection between the power bus and the row bus.

As best shown in FIG. 5, the row and power buses 12 and 16 are separated by an insulation layer 20 in the multilayer construction. The electrical connection 18 (FIGS. 2, 3, and 4) comprises a plurality of vias 26. Using conventional CMOS technology, the insulating layer 20 (FIG. 5) is deposited on the power bus 16. A recess or hole 17 is etched in the insulating layer 20. The row bus 12 is then deposited on the insulating layer 20, and it fills the hole 17 until an electrical connection is made between the row bus 12 and the power bus 16. As best shown in FIG. 4, the plurality of vias 26 are arranged in an arc E which faces an imaginary point 28 associated with the mouth 25 on the row bus 12. In a preferred embodiment, each of the plurality of vias 26 are located equidistant from the imaginary point 28. An advantage of this arrangement of vias 26 is that it permits the current to flow substantially evenly between the imaginary point 28 and each of the plurality of vias 26.

In operation, power is provided from a power supply (not shown) coupled to the power bus 16. Current travels along the row bus 12 to the mouth 25 of the end 22. Because the vias 26 are located equidistant from the imaginary point 28, the current flows substantially evenly between the imaginary point 28 and each of the plurality of vias 26. The current travels through the plurality of vias 26 to the power bus 16.

While the invention has been described with reference to a specific embodiment, this description is merely illustrative, and it is not to be construed as limiting the scope of the invention. Various other modifications and changes may occur to those skilled in the art without departing from the spirit and scope of the invention as defined by the appended claims.

What is claimed is:

1. An electrical connection between a first metal bus and a second metal bus separated by an insulator comprising:
 a plurality of vias connecting an end of the first bus to the second bus, said plurality of vias being arranged so that current flows substantially evenly through said plurality of vias; each of said vias including conductive material from the first bus which is in contact with the second bus through an aperture in the insulator.

2. The electrical connection as recited in claim 1 wherein said plurality of vias are located on an arc.

3. The electrical connection as recited in claim 2 wherein said arc faces an imaginary point associated with said first bus.

4. The electrical connection as recited in claim 1 wherein said first bus has a first side and a second side which are symmetrical along a center line which lies in the same direction as the current flows on the first bus.

5. The electrical connection as recited in claim 4 wherein a portion of each of said first and second sides diverge away from said center line.

6. The electrical connection as recited in claim 1 wherein said second bus is generally wider than said first bus.

7. The electrical connection as recited in claim 1 wherein said second bus is at least five times wider than said first bus.

8. The electrical connection as recited in claim 1 wherein said end is generally horn shaped.

9. The electrical connection as recited in claim 3 wherein said arc comprises a portion of a circle having as its center said imaginary point.

10. The electrical connection as recited in claim 9 wherein said first bus has a first side and a second side which are symmetrical along a center line which lies in the same direction as the current flows on the first bus, said first and second sides each having a portion which diverges away from said center line.

11. A chip comprising:
 a first metal bus and a second metal bus separated by an insulator,
 a plurality of cells coupled to said first bus; and
 a plurality of vias connecting an end of the first bus to the second bus, said plurality of vias being arranged so that current flows substantially evenly through said plurality of vias when current flows between the first and second bus; each of said vias including conductive material from the first bus which is in contact with the second bus through an aperture in the insulator.

12. The chip as recited in claim 11 wherein said plurality of vias are located on an arc.

13. The chip as recited in claim 12 wherein said arc faces an imaginary point associated with said first bus.

14. The chip as recited in claim 11 wherein said first bus has a first side and a second side which are symmetrical along a center line which lies in the same direction as the direction in which current flows on the first bus.

15. The chip as recited in claim 14 wherein a portion of each of said first and second sides diverges away from said center line.

16. The chip as recited in claim 11 wherein said second bus is generally wider than said first bus.

17. The chip as recited in claim 11 wherein said second bus is at least five times wider than said first bus.

18. The chip as recited in claim 11 wherein said end is generally horn shaped.

19. The chip as recited in claim 11 wherein said end has a mouth, said plurality of vias being arranged equidistant from said mouth.

20. The chip as recited in claim 19 wherein said first bus has a first side and a second side which are symmetrical along a center line which lies in the same direction as the current flows on the first bus, said first and second sides each having a portion which diverges away from said center line.

21. The chip as recited in claim 20 wherein said second bus is generally wider than said first bus.

22. The chip as recited in claim 21 wherein said second bus is at least five times wider than said first bus.

23. The chip as recited in claim 11 wherein said first bus is a row bus and said second bus is a power bus.

24. A chip comprising:
 a first metal bus and a second metal bus separated by an insulator, said second bus generally wider than said first bus, said first bus having a first side and a second side which are symmetrical along a center line which lies in the same direction as the current flows on the first bus, said first and second sides each having a portion which diverges away from said center line;
 a plurality of cells coupled to said first bus;
 a plurality of vias connecting an end of the first bus to the second bus, said end being generally horn shaped and said plurality of vias being arranged in an arc which faces an imaginary point associated with said end so that current will flow substantially evenly between the first and second bus; each of said vias including conductive material forming the first bus which is in contact with the second bus through an aperture in the insulator.

* * * * *